(12) United States Patent
Coster et al.

(10) Patent No.: US 6,538,192 B1
(45) Date of Patent: Mar. 25, 2003

(54) GLAZING FOR THE ROOF OF A MOTOR VEHICLE

(75) Inventors: Dominique Coster, Temploux (BE); Christian Guindon, Paris (FR); Denis Legrand, Wargnies (FR); Alain Masereel, Mérignies (FR); Pol Baudin, Fontaine l'Evêque (BE)

(73) Assignee: Glaverbel, S.A., Brussels (BE)

( * ) Notice: Subject to any disclaimer, the term of this patent is extended or adjusted under 35 U.S.C. 154(b) by 0 days.

(21) Appl. No.: 09/958,751
(22) PCT Filed: Apr. 12, 2000
(86) PCT No.: PCT/EP00/03332
§ 371 (c)(1),
(2), (4) Date: Mar. 13, 2002
(87) PCT Pub. No.: WO00/61366
PCT Pub. Date: Oct. 19, 2000

(30) Foreign Application Priority Data

Sep. 27, 1999 (BE) .............................................. 9900643
Apr. 13, 1999 (BE) .............................................. 9900251

(51) Int. Cl.$^7$ ...................... B32B 17/10; H01L 31/048; C03C 27/12
(52) U.S. Cl. ...................... 136/251; 136/256; 136/291; 428/426; 428/441; 296/215; 296/216.01; 257/433
(58) Field of Search ................................. 136/251, 256, 136/291; 428/426, 441; 296/215, 216.01; 257/433

(56) References Cited

U.S. PATENT DOCUMENTS

| | | | | |
|---|---|---|---|---|
| 4,717,790 A | * | 1/1988 | Gochermann | 136/251 |
| 5,213,626 A | * | 5/1993 | Paetz | 136/244 |
| 5,228,925 A | * | 7/1993 | Nath et al. | 136/251 |
| 5,849,402 A | * | 12/1998 | Kraemling et al. | 428/220 |
| 2002/0008410 A1 | * | 1/2002 | Teschner et al. | 296/211 |

FOREIGN PATENT DOCUMENTS

JP    4-334620 A    * 11/1992

* cited by examiner

Primary Examiner—Alan Diamond
(74) Attorney, Agent, or Firm—Piper Rudnick LLP; Jerold I. Schneider

(57) ABSTRACT

The invention relates to glazings adapted for automotive vehicle roofs. The glazing according to the invention comprises:
  a first sheet of glass on the external face of the roof;
  a second sheet of glass at at least a portion of the internal surface arranged towards the interior;
  an intermediate sheet of one or more traditional thermoplastic materials used for forming laminated glazings, which extends at least over the surfaces of the sheet of glass which face each other;
  functional non-transparent elements arranged under the first sheet of glass;
the transparent laminated portion having a luminous transmittance of less than 35 percent and an energy transmittance less than 20 percent.

15 Claims, 3 Drawing Sheets

GLAZING FOR THE ROOF OF A MOTOR VEHICLE

This invention relates to glazing intended for automotive roofs comprising a part providing a desired interior luminous transmittance.

BACKGROUND OF THE INVENTION

Automotive manufacturers are developing models having increasing glazed surface areas. The dimensions of windscreens and rear screens are increasing particularly to improve aerodynamic profiles. In addition, glazings are becoming preponderant in the manufacture of sunroofs. Following this tendency, manufacturers wish to use glazings to provide the whole of, or at least a significant part of the roofs of vehicles.

The aim of this invention is to provide glazings for vehicle roofs, having at least one portion having a desired transparency, and at least another portion which must satisfy different requirements of transparency. A typical case of glazings satisfying this requirement is that of glazings provided with photovoltaic cells. The invention is described in relation to glazings adapted to comprise cells of this type. However, the invention may be applied to other sort of glazings in respect of which only a part must offer the indicated transparency.

On certain models, particularly top of the range models, automotive manufacturers propose photovoltaic cells whose function is to limit the drain on the batteries, particularly when the vehicle motor is not running. This is currently used for example to recharge the batteries or to power a ventilation system and thus limit heating of the vehicle when stopped. Other applications have already been envisaged all of which have in common the provision of a complementary energy source to reduce the use of energy generated by the vehicle motor.

For good efficiency, the cells may be arranged on a surface which is as large as possible, and underneath a shield which protects them from environmental elements: humidity, grease etc. The cells are thus placed behind a transparent screen, usually provided by a sheet of glass.

For convenience, the cells have generally been arranged at the roof in vehicles which have already been commercialised. The adaptation of photovoltaic cells on glass roof elements has been the subject of various previous propositions.

With respect to these types of commercialised vehicles incorporating this type of equipment, the photovoltaic cells have been arranged on a sheet of glass forming at least part of the roof, and on the face of the sheet which is not exposed to the exterior. The cells are adhered to the sheet of glass and protected and hidden from the inside of the vehicle by a facade.

One difficulty for the manufacture of these roofs comprising cells resides in the fact that in order to satisfy safety standards, particularly with respect to mechanical resistance, the glass sheet must have a certain thickness. The thicker the glass, the less the energy transmitted to the cells.

In known articles, a sheet of tempered glass at least 5 mm thick has typically been necessary. At these thicknesses, ordinary clear glass has an absorption which is not negligible. The energy transmittance (ET) measured in the Moon system is about 82% of the incident radiation.

These known articles lead to a non-optimised efficiency for the cells. It is desirable to find a construction which reduces the absorption to a minimum without compromising the mechanical properties.

In this context, it is possible to use so-called "extra clear" glasses whilst keeping the structure described above. Theses glasses which have the particularity of having an extremely low quantity of iron have relatively low levels of absorption. At thicknesses under 5 mm, as previously described, the ET can be of the order of 90%, thus giving a gain of the order of 8%. The disadvantage of this glasses is its cost. The cost is approximately 2.5 times that of ordinary clear glass. Even if the cost of the glass only contributes to part of the total cost of the roof, this difference is not insignificant for the manufacturers.

Furthermore, in known structures, the use of a sheet of glass having an energy transmittance as great as possible to increase the efficiency of the photovoltaic cells is directly contradictory to the requirements of motor vehicle manufacturers regarding the transmittance in the interior of the vehicle. For reasons of comfort, the energy transmittance should be as low as possible, should not be greater than 20%, and should preferably be less than 15%. The use of clear glass and particularly extra clear glass, can only be envisaged if only a part of the roof will receive the cells, the rest being adapted for the vision of the passengers.

In order to satisfy the contradictory requirements previously referred to, it is possible to deposit a thin coating using a traditional techniques to limit the transmittance. The coating must nevertheless be limited to part of the sheet which does not carry cells, which increases in the complexity of the operation. In addition, the coating is relatively fragile, irrespective of the technique to form it, and at the interior of the vehicle, it remains exposed to the risk of degradation, abrasion etc. Faults resulting from such degradation are extremely sensitive to the extent that the coating absorbs and/or reflects a significant part of the incident light. Faults in the coating thus appear as luminous points or lines on a surface which is significantly less luminous.

SUMMARY OF THE INVENTION

The invention provides glazings for vehicle roofs having a new structure which responds to the previously described requirements. The glazings according to invention comprise at least one transparent portion, and at least one portion which is not transparent, particularly due to the presence of photovoltaic cells or other functional elements. This solution offers a number of advantages which will be described in more detail.

The following description refers to a vehicle roof. This designation relates to the case where the whole of the roof is envisaged. It also relates to the case where only part of the roof is equipped in the way described. It can easily be understood that the "glass portion" may be limited for example to the part comprising the movable element of a sunroof. The case of the complete roof corresponds best when seeking to arrange the cells on as large an area as possible, without necessarily ignoring other aspects. In addition the tendency in automotive design, referred to above, is clearly towards an increase in the glazed surface area. Embodiments according to invention which follow this tendency favour a roof made entirely of glass. The description and the examples referred in a non-limiting way to a roof made entirely of glass.

The roof glazings according to the present invention provide at least one transparent portion and one portion which is not transparent due to the presence of non transparent functional elements. It comprises a first sheet of glass comprising the external surface, a second sheet of glass comprising at least part of the internal surface of the roof, and an intermediate sheet of one or more thermoplastic materials traditionally used for forming laminated glazings, the intermediate sheet extending at least over the portions of the sheets of glass which are face-to-face. The non transparent functional elements, for example photovoltaic cells, are arranged under the first sheet of glass.

In the following, for reasons of convenience, photovoltaic cells are referred to in terms of functional elements. This example is particularly representative. However, the elements may be of any other non-transparent type which cover a significant portion of the surface of the roof.

The combined characteristics of the elements superposed in the transparent portion of the glazings are such that the energy transmittance of this portion is not greater than 25%, and preferably remains less than 20%. In the transparent portion, the luminous transmittance is at most 25%, and is usually less than 30%.

When the functional elements are photovoltaic cells, the first sheet of glass is chosen such that its energy transmittance ET is at least 82% and is preferably greater than 87%.

The laminated structure may extend over the whole of the glazings or only over a portion of the glazings. The transparent portion of the roof is always laminated. In contrast, the non transparent portion of the roof, the part where the cells are arranged, may comprise only the external sheet of glass.

In the case of a glazing which is partially laminated, it is advantageous to arrange for the first sheet of glass, which is the sheet of glass having the greatest dimensions, to be the only one that rests on the bodywork. It is important for reasons of assembly and sealing to avoid differences of level. For this reason, the choice of the dimensions of the sheet may lead to a first sheet having a periphery which is free over a few millimeters. In other words, the second sheet of glass is always set back a distance at least equal to that necessary for the positioning of the glazings on the bodywork.

By an appropriate choice of the sheet of glass and, or of the other constituents of the laminated assembly: coatings, enamel, properties of the intermediate sheet, it is possible to satisfy the requirements for energy transmittance in the vehicle. These requirements are directly contradictory to those regarding the exposure of the cells. In other words, the laminated structure allows the distinct and opposed requirements to be met according to the part of the glazings considered.

Roof glazings according to the invention also meets the mechanical resistance requirements of the designers. The roof contributes to the rigidity of the overall structure. Whichever form is chosen, wholly or partially laminated, the glazings according to invention provide the required mechanical properties under conditions indicated below.

If only it portion is laminated and transparent, the other portion which carries the cells being non transparent, the mechanical properties may be obtained in part by structural reinforcing elements such as metallic profiles or sheets arranged under the non laminated portion of the glazing. These elements which are integrated into the vehicle bodywork do not provide an interference given that they are positioned under the non transparent portion of the roof. These additional structural elements, and also the cells and various other elements, are masked from the interior of the vehicle by traditional coverings and facades.

Use of a glazing which is partially laminated instead of a glazing which is entirely laminated also allows for a significant weight gain. This aspect is of more significance given that the second sheet of glass, which is of restricted dimensions, is that which usually has the greatest thickness for the reasons described below particularly relating to energy transmittance.

When the glazing is entirely laminated, the inherent mechanical resistance of this type of structure may be sufficient to attain the required performance. In this case it is not necessary to arrange additional reinforcing elements under the non transparent portion of the glazing.

In embodiments according to invention, the sheets are assembled according to the usual techniques for obtaining laminated glazings.

In comparison with prior art constructions, the laminated glazing assembly allows, in particular reduction in the thickness of the sheet of glass which protects the cells when the lamination is carried out on the entire glazing and the cells are arranged between the two sheet of glass. A significant part of the resistance of the assembly is thus conferred by the second sheet glass whose energy transmittance characteristics, and thus thickness, are not determined by the presence of the photovoltaic cells.

Whilst the first sheet is advantageously of limited thickness, the total thickness of the laminated assembly influences the mechanical properties. As in the case of monolithic glazings, considerations of weight lead to a limiting of this thickness. It is best to try to keep the total thickness less than 10 millimeters, and preferably less than 7 mm.

As indicated above, according to whether the laminated assembly extends over practically the entire glazing surface or is limited to the transparent portion of roof, the thickness of the first sheet of glass is significantly different. However, in both cases, the first sheet of glass contributes to the mechanical resistance of the assembly. In the first case, the exterior sheet of glass must have a suitable thickness to provide suitable resistance to external forces, independently of the question of rigidifying the vehicle compartment. In the second case, the contribution of the first sheet of glass to this rigidifying is more significant.

For these reasons, in the first case sheets having a thickness which is not less than 1 mm are advantageously used. Conversely, in order to conserve the energy advantage even with ordinary soda lime glass, the thickness of this first sheet is not greater than 3 mm. In most cases, this thickness is comprised between 1.5 and 2.5 mm. For "clear" and "extra clear" glass, the thickness of the first sheet may be greater without losing the benefit of a higher level of energy transmittance. For these clear glasses, the thickness may reach 5 mm.

In the second case—that of "partial lamination"—the thickness depends on whether reinforcing elements for the structure are present or not. This thickness is necessarily greater than in the first case, and is advantageously from 2 to 6 mm, preferably from 3 to 5 mm.

The first sheet may, of course, be an extra clear glass to optimize the transmittance. In this case, the energy transmittance of the sheet may be greater than 90%. If a sheet of clear glass is used, the energy transmittance, again with respect to the thickness conditions referred to previously, is a little less but remains greater than 85%. By way of example, the energy transmittance of a commercially available extra clear glass at a thickness of 4 mm is 90.7. For a commercially available clear glass, again at 4 mm, the energy transmittance is 89.5. Of course, the thinner the sheet the higher the transmittance.

The second sheet of glass is chosen so as to provide the necessary resistance at least in the transparent portion. Considerations regarding its thickness with respect to the luminous transmittance are the opposite to those concerning the first sheet. In order for the roof to allow vision towards the outside whilst limiting energy transmittance in the interior, the second sheet must be very absorbent, and thickness is a significant factor in providing this absorption. In practice however a compromise must be chosen between the increase in this thickness, which is favorable for the mechanical resistance and for the absorption on one hand, and the necessity to keep the weight within reasonable limits on the other hand.

From the mechanical point of view, in the laminated assembly, and in association with the first sheets described above, sheets of 2 to 5 mm and, preferably, of 2.5 to 4 mm allow the standards in this field to be met. For these thicknesses, to obtain an energy transmittance not greater than 25%, and preferably not greater than 20 percent, strongly colored glasses are particularly used.

Due to the significance of the role of the second sheet of glass in glazing embodiments according to the invention, its nature will be described in more detail.

Coloured glasses which are useful in accordance with the invention are known from the prior art. Amongst glasses which allow a significant reduction in the energy transmittance, those having a neutral, a blueish, or a blue green colour in transmittance are preferred. In any case manufacturers desire a colour purity, in the sense of the CIE (Commission International de L'Eclairage) which is as low as possible. The aim of choosing these glasses is so that the light transmitted to the interior does not the deform the colours. Advantageously, a sheet of gray glass having an excitation purity less than 10% is used, and which at a thickness of 4 mm has a luminous transmittance (LTA) of less than 25%, and preferably less than 20%. Glasses corresponding to these conditions may be, for example, soda lime glasses having, in a traditional way, base constituents in the following relative weights:

| | | | |
|---|---|---|---|
| $SiO_2$ | 60–75% | $Al_2O_3$ | 0–5% |
| $Na_2O$ | 10–20% | BaO | 0–2% |
| CaO | 0–16% | BaO + CaO + MgO | 10–20% |
| $K_2O$ | 0–10% | $K_2O + NaO_2$ | 10–20% |
| MgO | 0–10% | | |

Colouring agents, particularly $Fe_2O_3$, Co, Se, $Cr_2O_3$, are added. "Grey" glasses of this type are particularly those having colouring agents in the following proportions:

| | |
|---|---|
| $Fe_2O_3$ | 1–1.65% |
| Co | 0.017–0.030% |
| Se | 0.001–0.0100% |

Another advantageous combination of colouring agents comprises chromium oxide. Preferred proportions are for example:

| | |
|---|---|
| $Fe_2O_3$ | 0.75–1.8% |
| Co | 0.0040–0.0180% |
| Se | 0.0003–0.0040% |
| $Cr_2O_3$ | 0.0010–0.0100% |

Glasses of this type are described in detail particularly in the publications FR-A-2 738 238 and 2 738 240.

All of the preceding glasses are very neutral and "gray" in transmittance. In other cases, as previously indicated, glazings in accordance with invention may have a blueish tint. To provide this type of glazing it is advantageous to use for the second sheet of glass essentially oxides of iron and cobalt as colouring agents in the following proportions:

| | |
|---|---|
| $Fe_2O_3$ (total iron) | 1.1–1.8% |
| FeO | 0.30–0.50% |
| Co | 0.0030–0.0270% | to which other agents may be added in the following limits:

| | |
|---|---|
| $Cr_2O_3$ | 0–0.0250% |
| $V_2O_5$ | 0–0.0500% |
| $CeO_2$ | 0–0.5% |
| $TiO_2$ | 0–1.5% |
| Se | 0–0.0100% |

Blue glasses satisfying this definition are described in detail in the European patent application filed on Dec. 22, 1998 under the number 98124371.0.

It is also possible to use a glass having a high selectivity (the ratio LTA/ET) such as those having colorants in the proportions:

| | |
|---|---|
| $Fe_2O_3$ (total iron) | 1.2–1.85% |
| FeO | 0.40–0.50% |
| Co | 0.0020–0.013% |
| $Cr_2O_3$ | 0–0.0240% |
| $V_2O_3$ | 0–0.1% |
| Se | 0–0.015% |

Theses glasses have a very dark colour, with a green to blue tint. Their selectivity is often greater than 1.65. They are described in detail in the French patent application filed on July 31 under the number 98/10020.

Another series of very selective coloured glasses having low energy transmittance which may be used for the second sheet of the laminated portion of the roof corresponds to compositions in which the colorants are: either

| | |
|---|---|
| $Fe_2O_3$ (total iron) | 1.2–1.8% |
| FeO | 0.25–0.35% |
| Co | 0.0020–0.010% |
| $Cr_2O_3$ | 0.001–0.0100% |
| $CeO_2$ | 0.1–0.8% |
| or | |
| $Fe_2O_3$ (total iron) | 0.9–1.8% |
| FeO | 0.25–0.40% |
| Co | 0.0010–0.010% |
| $Cr_2O_3$ | 0–0.0240% |
| $V_2O_5$ | 0–0.2% |

These glasses which are also highly coloured are gray green. They have a selectivity which is normally greater than 1.5. They are described in the publication EP-A-0887320.

The colorimetric characteristics of the second sheet of glass preferably satisfying the following relations:

$P<20$ $R<-P+80$ in which P is the excitation purity (CIE) measured at a thickness of 4 mm with illuminant C at 2° observer and R is the colour rendering index specified in the standard EN 410. This latter index relates the observations through a particular glazing to an assembly of the sample colours illuminated by reference illuminant D65. The less than the glazing modifies the perception of colours, the higher the colour rendering index. The proposed gray glasses are those having the highest colour rendering index. It is generally greater than 80% and can attain and even be greater than 90%. In comparison, the glasses which confer a blueish tint generally have a lower index of about 75%. Generally, sheets having a colour rendering index not less than 70 and preferably not less than 75% are used in glazings according to the invention.

The most neutral glasses, which are gray in colour, preferably satisfy the conditions:

$$P<10$$

$$R<-P+90$$

The use of highly coloured glasses usually leads to the desired transmittance. If however the chosen glass does not sufficiently reduce the transmittance, or if it is preferred to use a glass which is not as highly coloured, it is possible to provide the desired transmittance properties by use of a traditional thin absorbent and/or reflective coating, for example a coating based on titanium or chromium nitride, a coating of tin oxide which may be doped, a coating of indium and tin oxides etc. When such a coating is used it is advantageously protected from the risks of degradation by being arranged on the face of the sheet of glass which is in contact with the intermediate layer.

To enable a coating which uniformly covers the sheet to be provided, it is preferably arranged on the second sheet of glass. This avoids the necessity of accurately limiting the extent of the coating with respect to the position of the cells. Conversely, if the coating is applied on the first sheet, the position corresponding to the cells must be free of the coating to provide the greatest possible transmittance at these positions.

Another means of reducing the luminous transmittance which may be used according to the present invention consists of depositing an enamel comprising small sized points in a dense grid. The points must be of a sufficiently small size such that they are not discernible by observation from the interior. They are below the resolution threshold. Points of the few tenths of millimeters spaced about 0.5 to 2 millimeters apart may be chosen.

With an enamel pattern limiting the transmittance, the proportion of the surface covered determines the proportion of the non transmitted radiation. This proportion may be varied to a very large extent. The enamel may cover up to 70% of the surface whilst maintaining a certain "transparency". Preferably, it does not cover more than 60% of the surface.

When a pattern of enamel dots is used, it may be provided on one or the other of the sheets of glass provided that this pattern does not mask the cells.

An intermediate sheet of a thermoplastic material is arranged between the two sheets of glass. During lamination there may be a plurality of sheets of the same or of different materials making up the intermediate sheet. The thermoplastic sheet may also be formed in the assembly from a different state, particularly by polymerization or reticulation of a material in a liquid state. The indication intermediate sheet thus corresponds to the final form in the assembly and does not relate to the initial state of material even if the most usual form is that of a sheet.

The intermediate sheets are those generally used in the laminated glazings. In particular, sheets of polyvinyl butyral (PVB), polyvinyl acetate (EVA), polyurethane (PU) and polyvinyl chloride (PVC) may be used. When the cells are arranged between two sheets of glass, the thickness of the intermediate sheet or sheets must, be at least equal to that of the photovoltaic cells arranged in the assembly. In practice, the cells have a thickness between 0.1 and 1 mm. The intermediate sheets of ordinary laminated glazings have a thickness of the order of 0.3 to 2 millimeters. These thicknesses are thus suitable whether the cells are arranged in the lamination or not.

The absorption of the intermediate sheets is generally sufficiently low so as only to have a limited effect on the transmittance of the assembly. When a plurality of sheets is use to make up the intermediate sheet, it is nevertheless possible to combine their characteristics to respond to the aims sought by the invention. In particular, in the case of cells arranged between the two sheets of glass, it is possible to arrange a sheet of a material which contributes to the luminous absorption underneath the cells without detracting from the radiation received by the cells. In particular, materials such as coloured PVB in respect of which the energy transmittance for typical thicknesses of 0.76 mm may be as low as 15% may be used. Of course, commercial products allow a range of transmittances of intermediate values to be achieved.

When cells are arranged in the non laminated portion of the glazing, they may be arranged by adhesion to the first sheet of glass. Various adhesives may be used provided that they do not block the energy transmittance to the cells. The cells may also be secured by means of the thermoplastic sheet used for lamination. In this case, the thermoplastic sheet extends beyond the laminated portion to additionally cover the zone of the cells. A sheet of EVA is particularly well suited to this type of construction. In another embodiment, the cells may be secured by an adhesive of sheet arranged so as to envelop them.

When cells are arranged in the lamination, the method of introducing them in the intermediate sheet depends in part on the malleability of the intermediate sheet. For products which are easily formed, it is possible to print the impression corresponding to the cells in the sheet and to subsequently position the cell in the said impression. For sheets which are less easily formed, it may be preferable to associate at least two sheets of which one has a thickness which is substantially equal to that of the cells. The sheet is stamped to cut out housings to the dimensions of the cells. It is subsequently associated with at least one sheet to constitute an assembly similar to the printed sheet described above. In both cases, an additional sheet is superpositioned when necessary with the assembly carrying the cells and the electrical connections so as to entirely cover the cells in a relatively flexible product and avoid contact with the surfaces of the sheets of glass.

In order to facilitate incorporation of the cells in the intermediate sheet, characteristics of different materials may be combined. For example, a preformed sheet of PVB comprising housings for the cells may be associated with a flexible film, for example of EVA, which allows a perfectly uniform introduction and adhesion of the cells in the intermediate sheet.

For aesthetic reasons, it is also advantageous according to the invention to mask the edges of the cells or at least those comprising electrical connections, as well as the connections, and generally all parts which introduce a discontinuity in the appearance on the product, by means of an enamel in a pattern obtained by silk screen printing. When these enamel portions are intended to mask discontinuities from the outside, they are arranged on the first sheet of glass.

Glazings according to the invention are laminated using traditional techniques. For preformed intermediate sheets, such as PVB sheets, two stages are generally followed: a first step of de-gassing followed by an adhesion step. The technique used is particularly described in the publication FR-A-2428920, relative to in encapsulation of photovoltaic cells in a laminated assembly.

Other methods of lamination may also be used, particularly when a liquid material is used to constitute the intermediate sheet.

BRIEF DESCRIPTION OF THE DRAWINGS

The invention is described in the following portion with reference to the drawings of which.

DETAILED DESCRIPTION OF THE INVENTION

Figure 1:
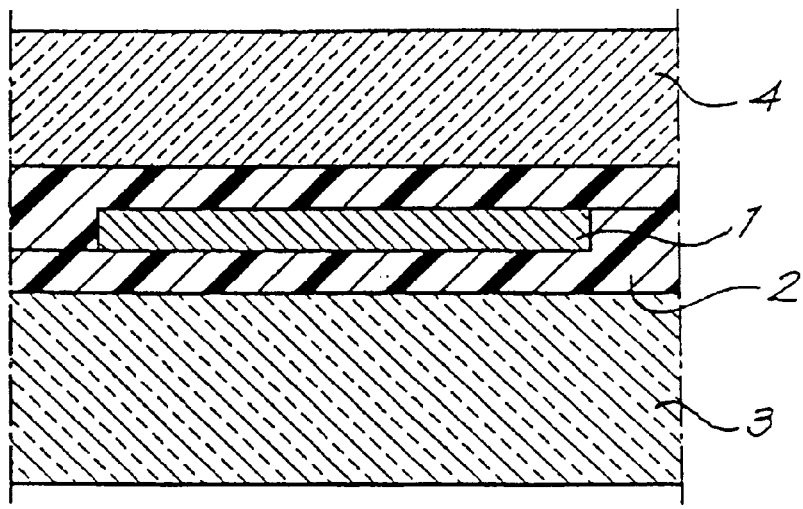
FIG. 1 is a schematic cross-section view of a roof assembly according to the invention.
Figure 2:
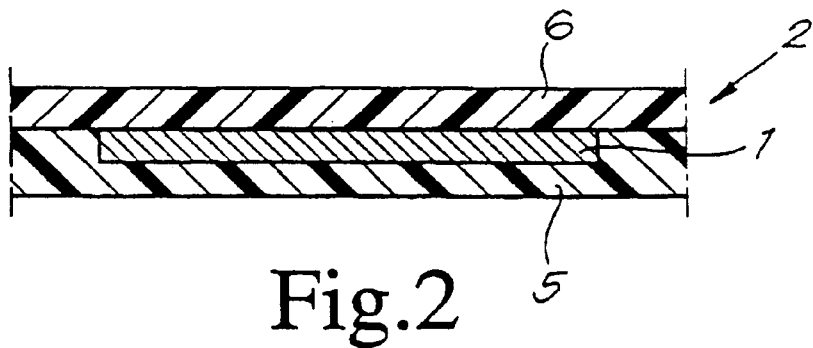
FIG. 2 is a schematic cross-sectional view of one embodiment of the insertion of the photovoltaic cells according to invention.

The cross-section of FIG. 1 comprises a photovoltaic cell, indicated schematically at 1, with connections. The cell is enveloped in an intermediate sheet 2 constituted for example by colourless PVB. The figure shows the material of the intermediate sheet being homogeneous. This is the structure obtained after the laminating operation from sheets that are initially separate as shown in FIGS. 1 and 2. The structure of the intermediate sheet may also be obtained when a material which is in a liquid state prior to the laminating operation is used. The external face of the assembly is constituted by a sheet of glass 4 having characteristics, composition and thickness, such that the luminous transmittance is as high as possible and is not less than 82%. The internal face, that is to say that orientated towards the interior, is constituted by a sheet of glass 3 having a luminous transmittance which is not greater than 35%.

The material making up the intermediate layer is as little absorbent as possible so that the incident radiation having gone through the sheet 4 arrives almost entirely on the cell. When an absorbent material is used, the thickness of the material separating the cell and the sheet 4 is kept as small as possible. It is preferable to keep a minimal amount of intermediate material between the cell and the sheet 4 so as to protect the cell from damage during the assembly operations. Pressure exerted on the cell is thus spread more evenly across the whole cell due to the elasticity of the intermediate material.

The sheet 4 is represented as being significantly less thick than the sheet 3. As indicated above, it is preferable to keep the thickness of the sheet 4 as small as possible to limit its absorption. Conversely, sheet 3 which contributes more predominantly to the mechanical properties required for the assembly is advantageously thicker.

FIG. 2 shows a means of inserting the cell in the intermediate material. In the embodiment shown, the cell is positioned between the two sheets 5 and 6. A housing corresponding to the dimensions of the cell is stamped in one of the sheets (sheet 6 in the figure) so as to avoid exerting excessive pressure on the cell during assembly. The materials used are sufficiently malleable to allow this type of assembly. Once the cell has been arranged in its housing, the sheet 6 covers the assembly and the laminating process is carried out in the usual way. For example, with the intermediate sheet placed between the two sheets of glass 3 and 4, a degassing procedure under partial vacuum is carried out. Simultaneously, pressure is prevented from being applied to the surfaces of the glass sheets which would make the degassing more difficult. After degassing, the temperature of the assembly is progressively increased whilst allowing the external pressure to act against the assembly. The last traces of air are thus dissolved in the material which sticks to the sheets of glass. Simultaneously the sheets 5 and 6 are welded together so as to constitute a single mass in which the cells are incorporated.

Figure 3:
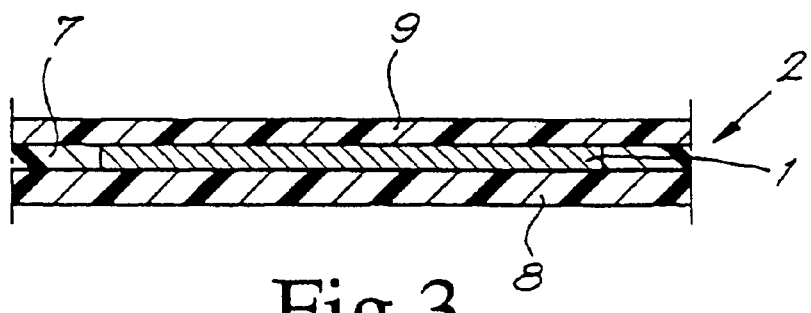
FIG. 3 is a cross-sectional view of another embodiment of insertion of photovoltaic cells.

FIG. 3 represents a similar principle. To make up the intermediate sheet, three sheets for example of PVB 7,8 and 9 are assembled. The intermediate sheet 7, having a thickness which corresponds approximately to that of the cell, is stamped. The openings made in the sheet 7 received the cells and the process proceeds as before having arranged sheets 8 and 9 on either side of sheet 7.

Figure 4:
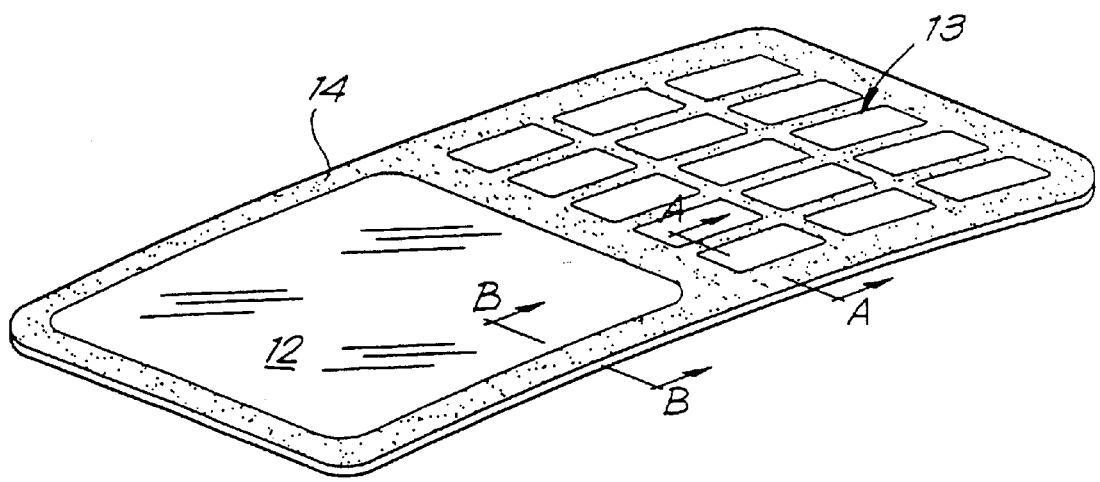
FIG. 4 is a schematic perspective view of a roof provided with photovoltaic cells.
Figure 5:
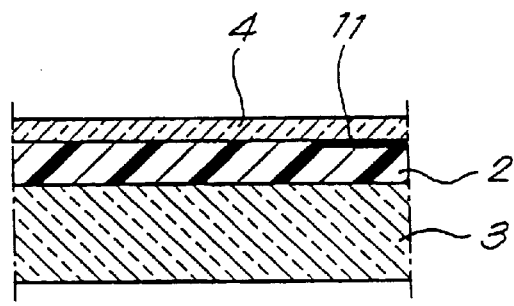
FIG. 5 is a cross-sectional view along B—B of FIG. 4
Figure 6:
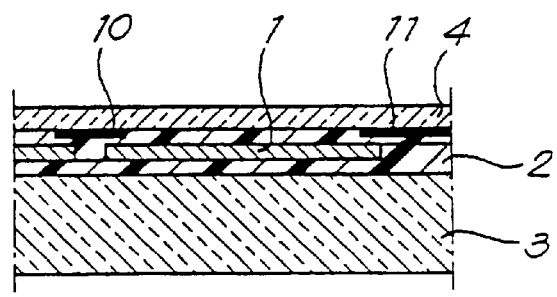
FIG. 6 is a cross-sectional view along A—A of FIG. 4.

FIG. 4 illustrates an automotive roof according to the invention. The roof comprises two distinct functional zones. Zone 12 corresponds to the transparent portion allowing vision from the inside of the vehicle. Zone 13 is the zone with cells. An enamel pattern 14 is shown in an accentuated way in this figure, the enamel pattern being adapted to mask for example the fixation of the periphery of the roof and the spaces between the cells, spaces in which electrical connectors are arranged. In this figure the enamel pattern is arranged around the periphery of each cell. If it is desired only to mask the connections, the enamel may be limited to longitudinal and transverse strips and not to the square pattern and shown. Details of the structure are shown in FIGS. 5 and 6.

In the zone 12 adapted for vision, the assembly is made up of two sheets of glass 3 and 4, and the intermediate sheet 2. An enamel band 11 is provided at the edge of the roof. The enamel is preferably arranged on the external sheet 4, and, more precisely, on the face of the sheet in contact with the intermediate sheet. In the same way, FIG. 6 shows an enamel band 10 which masks the junction between two neighbouring cells.

In this zone 12 the luminous transmittance, which is very low due to the characteristics of the sheet of glass 3, is sufficient to allow the passengers to see through the roof from the interior of the vehicle. Conversely, vision from the exterior to the interior of the vehicle is practically zero when the interior is not illuminated. From the exterior, the roof appears almost uniformly dark, and on this background, the enamel strips can only just be distinguished.

In the zone 13, the assembly of the enamel pattern and the photovoltaic cells covers the entire surface. This portion is not transparent. The cells which are covered by a sheet of glass which provides a very high transmittance are in the best conditions for efficiency.

Figure 7:
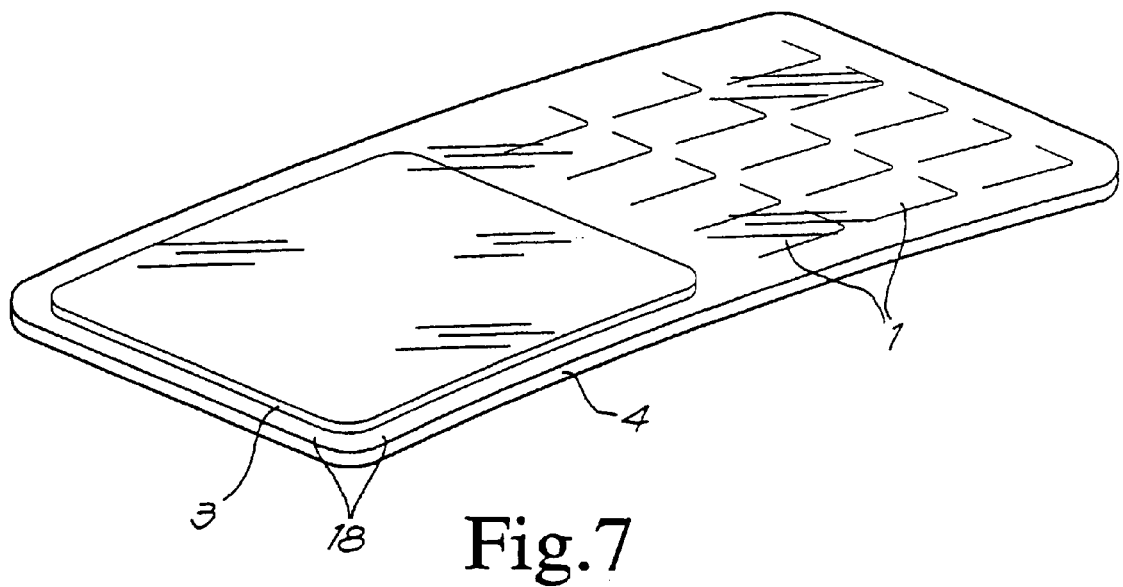
FIG. 7 is a schematic perspective view, similar to FIG. 4, in which the lamination is limited to the transparent portion.

FIG. 7 shows schematically an embodiment of the invention in which the laminated portion is distinct from the portion which carries the cells. The figure only shows the glazing and the position occupied by the cells.

In this embodiment, the transparent laminated portion does not cover the entire width of the glazed roof. A peripheral zone 18 of the external sheet 4 is outside the lamination. The cells are arranged on the sheet 4 for example by adhesion. Alternatively the zones 18 as well as the spaces between the cells can be provided with an enamel as in the embodiment of FIG. 4. The intermediate sheet, not shown, extends under the sheet 3, including in the portion occupied by the cells. It does not cover the zones 18 which are reserved for fixation on the bodywork of the vehicle by specific fixation means.

The width of the zones 18 is usually limited. Their aim is to maintain the same level over the whole width of the glazing. It is important to ensure that there is no discontinuity in the level to provide good fixation on the bodywork. The width necessary to arrange the glazing on the bodywork is generally of the order of 20 to 50 mm.

Figure 8:
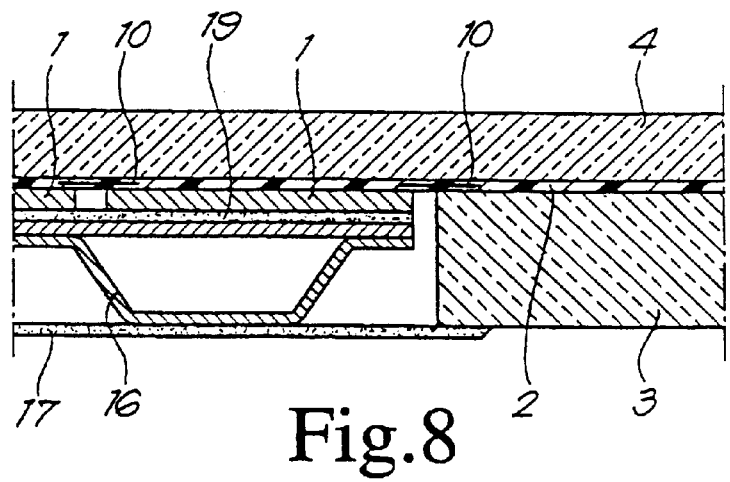
FIG. 8 is a cross-section of a portion of a glazing of the type of FIG. 7.

FIG. 8 shows details of a structure of the type shown in FIG. 7. The cross-section of this figure is arranged at the transition between the laminated portion and the portion carrying the photovoltaic cells. The external sheet 4 covers the assembly. The cells 1 are arranged outside the laminated portion underneath the sheet 4. They are stuck to the sheet 4 by means of the intermediate sheet 2, comprising for example a sheet of EVA. As before, the periphery of the cells and the limits between the laminated portions and the non laminated portions are masked by enamel strips 10 arranged on the internal surface of sheet 4.

The non laminated portion of the sheet 4 is supported by metal supports such as at 16. A facing 17 covers the assembly from the inside of the vehicle other than at the transparent laminated portion. For aesthetic reasons, the facing 17 also covers the edge of the sheet 3. A flexible sheet 19 is positioned between the cells and the supports 16 so as to avoid direct contract. The sheet may be for example felt or a sheet of thick cardboard or a synthetic material which may be foamed.

The following table sets out characteristics of luminous transmittance (LTA) and energy transmittance (ET) for different glasses for laminated assemblies. TE is measured according to the Moon system.

For these assemblies, the first sheet is ordinary, clear soda lime glass corresponding to the composition indicated above. The second sheet is a gray glass which provides a high absorption of the type described in the publication FR-A-2738240. When an athermic coating is present, this is arranged on the second sheet of glass. This may be a coating based on doped tin oxide having a thickness of about 400 nm.

The aim of examples 1 and 2 is to show the significant role of the second sheet of glass in determining the energy transmittance of the assembly.

Comparison between examples 1 and 6 allows on one hand the respective roles of the gray sheet which is present in both cases to be shown and on the other hand the role of the clear glass sheet and the intermediate sheet of PVB which is only present in example 6 to be shown. In the latter case, the energy transmittance is only lowered by 0.6%. In other words, the presence of a clear glass sheet having a thickness of 1.8 mm and the 1 mm thick intermediate sheet of PVB only very slightly affects the radiation received by the cells in the configurations according to the invention in which the cells are in the laminated portion.

The thickness of the second sheet has a significant effect. Examples 1 and 2, but also 3 and 6, may be compared in this respect.

The presence of the athermic coating also allows efficient control of the energy transmittance of the assembly. As can be seen, this may allow the thickness of the second sheet of glass to be limited without sacrificing the decrease of energy transmittance in the interior.

|   | Thickness sheet 1 | Thickness of PVB | Thickness of sheet 2 | Coating | Total thickness | LTA | ET |
|---|---|---|---|---|---|---|---|
| 1 |   |   | 3.15 |   |   | 24.1 | 21.4 |
| 2 |   |   | 4 |   |   | 16.9 | 14.7 |
| 3 | 2.5 | 1 | 4 |   | 7.5 | 16.5 | 14.3 |
| 4 | 1.5 | 0.76 | 3.15 | YES | 5.41 | 13.6 | 11.6 |
| 5 | 1.8 | 1 | 3.15 | YES | 5.95 | 13.6 | 11.5 |
| 6 | 1.8 | 1 | 3.15 |   | 5.95 | 23.7 | 20.8 |

The second table sets out data comparable to that in the first table. The difference resides in the choice of the glass which makes up the second sheet. In this particular case, gray glass which is even more absorbent than for the first series is chosen. As can be seen, this allows further significant reduction in the energy transmittance for the portion of the roof which does not comprise the photovoltaic cells. The previous remarks regarding the characteristics of the first sheet of glass and the intermediate sheet also apply to these examples. In other words, the transmittance remains high at the cells.

|   | Thickness sheet 1 | Thickness of PVB | Thickness of sheet 2 | Coating | Total thickness | LTA | ET |
|---|---|---|---|---|---|---|---|
| 7 |   |   | 3.15 |   |   | 15.9 | 13.7 |
| 8 |   |   | 4 |   |   | 10 | 8.4 |
| 9 | 2.5 | 1 | 4 |   | 7.5 | 9.8 | 7.8 |
| 10 | 1.5 | 0.76 | 3.15 | YES | 5.41 | 9 | 7.1 |
| 11 | 1.8 | 1 | 3.15 | YES | 5.95 | 9 | 7 |
| 12 | 1.8 | 1 | 3.15 |   | 5.95 | 15.6 | 12.8 |

As can be seen in this table, the energy transmittance can be significantly lowered simply by choosing a suitable glass for the second sheet glass even without relying on additional coatings.

Further assemblies were made using partial enamelling of the transparent portion to reduce transmittance. The assemblies all comprised a first sheet of clear glass having a thickness of 2.5 mm, a 0.76 mm thick intermediate sheet and a 2.5 mm thick sheet of gray glass of the type used in examples 1 to 6. The enamelling is preferably carried out on the first sheet at that same time as the masking of the edges of the sheet and of the electrical connections.

Examples 13 to 16 correspond to laminated glazings in which an increasing proportion of the surface of the transparent portion is covered with enamel dots. Examples 17 to 20 are similar to examples 13 to 16 above, but in addition, an athermic coating is used, like that described in relation to examples 4,5,10 and 11. For reasons of simplicity, it is preferred to deposit the athermic coating on the gray sheet. In this way, the coating may cover the entire surface without interfering with the transmittance to the photovoltaic cells.

The following table gives the transmittance characteristics for these different assemblies. By way of example, the 2.5 mm thick clear glass sheet has a luminous transmittance LTA of 91.5 and an energy transmittance ET of a 90.5. This corresponds practically to that received by the cells.

| % enamelling | coating | LTA | ET |
|---|---|---|---|
| 13 | | 33.5 | 30 |
| 14 | 50 | 16.5 | 15 |
| 15 | 60 | 13.5 | 12 |
| 16 | 70 | 12 | 9 |
| 17 | YES | 18.5 | 15.5 |
| 18 | 50 YES | 9.5 | 8 |

Whilst partial enamelling allows the transmittance to be reduced in proportion to the surface covered, it cannot be used on its own to achieve the lowest transmittance without altering the desired "transparent" character. In this respect, when the transmittance must be extremely low, different embodiments may advantageously be combined. Examples 18, 19 and 20 thus propose simultaneous affects of colouration of the second sheet, partial enamelling and an athermic coating.

In FIGS. 4 and 7, the illustrated glazings comprise a portion at which the cells are assembled. Different arrangements may be preferred according to the requirements of each vehicle. Another particular arrangement comprises for example arranging the cells around the periphery of the roof, leaving the transparent portion in the middle of this. In this arrangement the non-transparent zones around the periphery may increasing aesthetic appeal by confusing the zones carrying the cells with the zones corresponding to the bodywork, and "enlarging" the latter. Of course, these examples do not limit the possible arrangements of the transparent and non-transparent zones of the roofs according to the invention.

What is claimed is:

1. Glazing for an automotive vehicle roof having at least one transparent laminated portion, comprising:
    a first sheet of glass at the external face of the roof;
    a second sheet of glass at at least a portion of the internal surface of the roof arranged towards the interior;
    an intermediate sheet of one or more conventional thermoplastic materials used for forming laminated glazings, which extends at least over surfaces of the first and second glass sheets which face each other;
    functional non-transparent elements arranged under the first sheet of glass;
    the transparent laminated portion having a luminous transmittance of less than 35 percent and an energy transmittance less than 20 percent.

2. The glazing according to claim 1 and further including at least one of the following (a) through (f)
    (a) the first sheet of glass has an energy transmittance of at least 82%;
    (b) the non-transparent functional elements comprise photovoltaic cells;
    (c) the first sheet of glass has a thickness of 2.0 to 6.0 mm;
    (d) the second sheet of glass has a thickness of 2.0 to 5.0 mm;
    (e) the laminated portion has a thickness of less than or equal to 10 mm;
    (f) the intermediate sheet comprises one or more sheets of thermoplastic material selected from the group consisting of: polyvinylbutyral (PVB), copolymers of vinyl ethylene and vinyl acetate (EVA), polyurethane (PU), and polyvinyl chloride (PVC).

3. The glazing according to claim 2 and further including at least two of the features (a) through (f).

4. The glazing according to claim 2 and further including all of the features (a) through (f).

5. The glazing according to claim 1 wherein the functional elements are adhered to the internal face of the first sheet of glass.

6. The glazing according to claim 1 in which the intermediate sheet extends beyond the laminated portion and in which the functional elements are adhered on the intermediate sheet which extends beyond the laminated portion underneath the first sheet of glass.

7. The glazing according to claim 1 further including a non-laminated portion, the first sheet of glass having dimensions greater than those of the second sheet of glass, and the functional non-transparent elements are arranged under the first sheet of glass at a portion which is not laminated.

8. The glazing according to claim 1 wherein the sheets of glass have substantially the same dimensions and form an entire laminated assembly and the functional non-transparent elements are housed between the sheets of glass.

9. The glazing according to claim 1 in which, during assembly of the sheets, the intermediate sheet comprises three sheets, and the functional non-transparent elements are in housings provided in a sheet arranged between the two other sheets which also form part of the intermediate sheet, the housings either provided by:
    (a) impressions in the sheet, or
    (b) stampings in the sheet.

10. The glazing according to claim 9 in which the total thickness of the intermediate sheet is between 0.3 and 2.0 mm.

11. The glazing according to claim 1 in which the transmittance of the transparent portion is at least partially controlled by either:
    (a) an enamel arranged according to a pattern comprising very small dots arranged in a dense grid, the enamel being arranged at the surface of one of the sheets of glass in contact with the intermediate sheet; or
    (b) a thin coating arranged on one of the sheets of glass at a surface which is in contact with the intermediate sheet.

12. The glazing according to claim 11 wherein the transmittance is at least partially controlled by the thin coating, and
    the thin coating is the athermic.

13. The glazing according to claim 12 wherein the thin coating is selected from the group consisting of: titanium nitride, chromium nitride, indium oxide, tin oxide, doped tin oxide, and indium tin oxide.

14. The glazing according to claim 11 wherein the transmittance is at least partially controlled by the thin coating, and
    the thin coating is a silver based reflective coating.

15. The glazing according to claim 1 in which the transmittance of the transparent portion is at least partially controlled by an enamel arranged according to a pattern which covers the internal surface of the first sheet of glass while leaving free the transparent portion of the glazing and the position of the functional, non-transparent elements.

* * * * *